(12) United States Patent
Zhai

(10) Patent No.: US 11,664,474 B2
(45) Date of Patent: May 30, 2023

(54) ARRAY SUBSTRATE, FABRICATION METHOD FOR ARRAY SUBSTRATE, AND DISPLAY PANEL

(71) Applicant: TCL CHINA STAR OPTOELECTRONICS TECHNOLOGY CO., LTD., Shenzhen (CN)

(72) Inventor: Yuhao Zhai, Shenzhen (CN)

(73) Assignee: TCL CHINA STAR OPTOELECTRONICS TECHNOLOGY CO., LTD, Shenzhen (CN)

( * ) Notice: Subject to any disclaimer, the term of this patent is extended or adjusted under 35 U.S.C. 154(b) by 132 days.

(21) Appl. No.: 15/734,399

(22) PCT Filed: Sep. 11, 2020

(86) PCT No.: PCT/CN2020/114869
§ 371 (c)(1),
(2) Date: Dec. 2, 2020

(87) PCT Pub. No.: WO2022/032784
PCT Pub. Date: Feb. 17, 2022

(65) Prior Publication Data
US 2022/0052219 A1    Feb. 17, 2022

(30) Foreign Application Priority Data

Aug. 12, 2020  (CN) .......................... 202010806540.4

(51) Int. Cl.
*H01L 31/113* (2006.01)
*H01L 31/0216* (2014.01)
(Continued)

(52) U.S. Cl.
CPC .... *H01L 31/1136* (2013.01); *H01L 31/02161* (2013.01); *H01L 31/18* (2013.01);
(Continued)

(58) Field of Classification Search
CPC ........... H01L 31/1136; H01L 31/02161; H01L 31/18; H01L 31/028; H01L 31/0296;
(Continued)

(56) References Cited

U.S. PATENT DOCUMENTS

2012/0052637 A1* 3/2012 Komatsu .......... H01L 21/02532
438/479
2012/0115285 A1* 5/2012 Komatsu .......... H01L 29/66765
438/479
(Continued)

FOREIGN PATENT DOCUMENTS

CN    102243992 A    11/2011
CN    102290461 A    12/2011
(Continued)

OTHER PUBLICATIONS

Mikhantiev et al., "Silicon monoxide influence on silicon nanocrystal formation" International Conference and Seminar of Young Specialists on Micro/Nanotechnologies and Electron Devices (pp. 29-33), 2012 IEEE (Year: 2012).*

(Continued)

*Primary Examiner* — Sitaramarao S Yechuri
(74) *Attorney, Agent, or Firm* — The Roy Gross Law Firm, LLC; Roy Gross

(57) ABSTRACT

Embodiments of the present application provide an array substrate, a fabrication method for an array substrate, and a display panel. The array substrate includes a substrate, a gate, a gate insulating layer, a seed layer, and a semiconductor layer that are sequentially stacked. A surface of the semiconductor layer away from the seed layer has a con- (Continued)

cave-convex structure formed by growth of nanocrystalline grains, which enhances light absorption of the semiconductor layer and solves the problems of poor light sensitivity and slow response speed of semiconductor devices.

17 Claims, 4 Drawing Sheets

(51) Int. Cl.
| | | |
|---|---|---|
| H01L 31/18 | (2006.01) | |
| H01L 31/0328 | (2006.01) | |
| H01L 31/028 | (2006.01) | |
| H01L 31/0296 | (2006.01) | |
| H01L 27/144 | (2006.01) | |

(52) U.S. Cl.
CPC ........ *H01L 27/1443* (2013.01); *H01L 31/028* (2013.01); *H01L 31/0296* (2013.01); *H01L 31/0328* (2013.01)

(58) Field of Classification Search
CPC ........... H01L 31/0328; H01L 31/02366; H01L 31/0264; H01L 31/0392; H01L 27/1443; H01L 27/14683; H01L 27/14601
See application file for complete search history.

(56) References Cited

U.S. PATENT DOCUMENTS

| | | | |
|---|---|---|---|
| 2012/0187408 A1* | 7/2012 | Tanaka | .................. H01L 29/04 438/157 |
| 2020/0135936 A1 | 4/2020 | Cao | |

FOREIGN PATENT DOCUMENTS

| | | | | |
|---|---|---|---|---|
| CN | 102386072 A | | 3/2012 | |
| CN | 103270571 A | | 8/2013 | |
| CN | 106783627 A | | 5/2017 | |
| CN | 111987111 A | * | 11/2020 | ......... H01L 27/1222 |
| KR | 100678739 B1 | * | 2/2007 | |

OTHER PUBLICATIONS

Zhou et al., "P-type Si nanocrystal thin-film transistor" 2008 IEEE Silicon Nanoelectronics Workshop (pp. 1-2) (Year: 2008).*

* cited by examiner

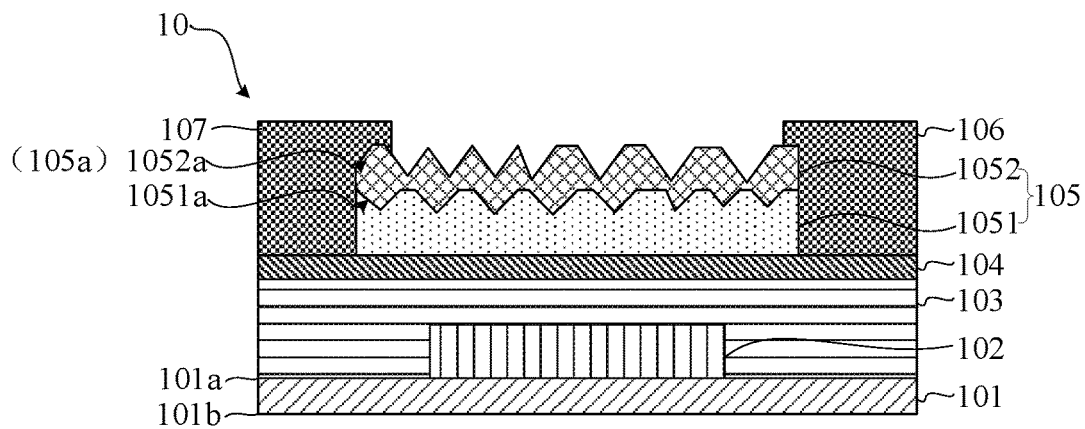

FIG. 4

| providing a substrate, wherein the substrate comprises a first surface and a second surface that are opposed to each other | ~201 |

| disposing a gate on the first surface, wherein the gate partially covers the first surface | ~202 |

| disposing a gate insulating layer on a side of the gate away from the first surface, wherein the gate insulating layer extends to the first surface | ~203 |

| disposing a seed layer on a side of the gate insulating layer away from the gate | ~204 |

| disposing a semiconductor layer on a side of seed layer away from the gate insulating layer, wherein the semiconductor layer partially covers a side of the seed layer, and a surface of the semiconductor layer away from the seed layer has a concave-convex structure formed by growth of nanocrystalline grains | ~205 |

FIG. 5

ARRAY SUBSTRATE, FABRICATION METHOD FOR ARRAY SUBSTRATE, AND DISPLAY PANEL

CROSS REFERENCE TO RELATED APPLICATIONS

This application is a National Phase Entry of PCT/CN2020/114869 filed on Sep. 11, 2020 claiming priority to Chinese application 202010806540.4 filed Aug. 12, 2020. The contents of these applications are incorporated by reference in their entirety.

FIELD OF INVENTION

The present application relates to a field of semiconductor technology, and more particularly to an array substrate, a fabrication method for an array substrate, and a display panel.

BACKGROUND

Display panels with photodetectors of low-cost and low power-consumption are essential for smart wearable products in applications such as remote sensing, photometer, thermal imaging, and environmental monitoring, etc. Photodetectors are widely used mainly based on quantum dots, superlattices and heterojunction structures. At present, low charge transfer mobility of photodetectors has become a bottleneck for development thereof.

Since indium gallium zinc oxide thin film transistors (IGZO TFTs) have low subthreshold swing (S.S.), low off-state current density, and high electron mobility of 10-50 $cm^2/V*s$, after combining indium gallium zinc oxide (IGZO) with a light-sensitive film layer, light can be converted into current more effectively in the case of having an electron transport layer with high mobility, so a panel having heterojunction transistors is able to achieve high efficiency and a high response rate. In related technologies, a double-layer structure is used to adjust performance of a sensor, in which a lower layer adjusts a threshold voltage, and an upper layer absorbs light. However, light absorption efficiency in related technologies is low. How the double-layer structure can be improved to increase light absorption efficiency of semiconductors, thereby improving light sensitivity of semiconductors is a problem that needs to be solved.

SUMMARY

Embodiments of the present application provide an array substrate, a fabrication method for an array substrate, and a display panel, which can improve light sensitivity of thin film transistor devices.

An embodiment of the present application provides an array substrate, comprising:

a substrate, wherein the substrate comprises a first surface and a second surface that are opposed to each other;

a gate, wherein the gate partially covers the first surface;

a gate insulating layer, wherein the gate insulating layer is disposed on a side of the gate away from the first surface and extends to the first surface;

a seed layer, wherein the seed layer is disposed on a side of the gate insulating layer away from the gate; and a semiconductor layer, wherein the semiconductor layer partially covers a side of the seed layer away from the gate insulating layer, and a surface of the semiconductor layer away from the seed layer has a concave-convex structure formed by growth of nanocrystalline grains In some embodiments, the semiconductor layer comprises a crystalline layer and a conductive layer, the crystalline layer partially covers a side of the seed layer away from the gate insulating layer, and a surface of the crystalline layer away from the seed layer has a concave-convex structure formed by growth of nanocrystalline grains, the conductive layer is correspondingly disposed on a side of the crystalline layer away from the seed layer, and the conductive layer has a concave-convex structure.

In some embodiments, the concave-convex structure is any one of an irregular pulse shape, a sawtooth shape, a wave shape, and a concave-convex broken line shape.

In some embodiments, a carrier concentration of the crystalline layer is higher than a carrier concentration of the conductive layer.

In some embodiments, a thickness of the crystalline layer is 5 nm to 50 nm.

In some embodiments, a material of the crystalline layer is zinc oxide (ZnO), silver (Ag), carbon (C), or a combination thereof.

In some embodiments, a material of the seed layer is a metal oxide, a metal, an alloy, or a combination thereof, and a thickness of the seed layer is 5 nm.

In some embodiments, further comprising a source and a drain, wherein the source and the drain are disposed in a region of the seed layer not covered by the semiconductor layer, and the source and the drain are respectively disposed on both sides of the semiconductor layer perpendicular to the first surface.

Embodiments of the present application further provides a fabrication method for an array substrate, comprising:

providing a substrate, wherein the substrate comprises a first surface and a second surface that are opposed to each other;

disposing a gate on the first surface, wherein the gate partially covers the first surface;

disposing a gate insulating layer on a side of the gate away from the first surface, wherein the gate insulating layer extends to the first surface;

disposing a seed layer on a side of the gate insulating layer away from the gate; and disposing a semiconductor layer on a side of seed layer away from the gate insulating layer, wherein the semiconductor layer partially covers a side of the seed layer, and a surface of the semiconductor layer away from the seed layer has a concave-convex structure formed by growth of nanocrystalline grains.

In some embodiments, disposing the semiconductor layer on the side of the seed layer away from the gate insulating layer comprises:

disposing a crystalline layer on a side of the seed layer away from the gate insulating layer, and the crystalline layer has a concave-convex structure on the surface of the side away from the seed layer formed by growth of nanocrystalline grains;

disposing a conductive layer on a side of the crystal layer away from the seed layer, wherein the conductive layer has a concave-convex structure; and performing etching to the crystalline layer and the conductive layer so that the crystalline layer and the conductive layer partially cover the seed layer to obtain the semiconductor layer.

In some embodiments, disposing the crystalline layer on the side of the seed layer away from the gate insulating layer is formed by using a method of an atomic layer deposition, a chemical vapor deposition technique, a sol-gel method, or a sputtering method.

In some embodiments, disposing the seed layer on the side of the gate insulating layer away from the gate comprises depositing aluminum oxide as the seed layer by using atomic layer deposition.

Embodiments of the present application further provides a display panel, comprising an array substrate, wherein the array substrate comprises:

a substrate, wherein the substrate comprises a first surface and a second surface that are opposed to each other;

a gate, wherein the gate partially covers the first surface;

a gate insulating layer, wherein the gate insulating layer is disposed on a side of the gate away from the first surface and extends to the first surface;

a seed layer, wherein the seed layer is disposed on a side of the gate insulating layer away from the gate; and a semiconductor layer, wherein the semiconductor layer partially covers a side of the seed layer away from the gate insulating layer, and a surface of the semiconductor layer away from the seed layer has a concave-convex structure formed by growth of nanocrystalline grains.

In some embodiments, the semiconductor layer comprises a crystalline layer and a conductive layer, the crystalline layer partially covers a side of the seed layer away from the gate insulating layer, and a surface of the crystalline layer away from the seed layer has a concave-convex structure formed by growth of nanocrystalline grains, the conductive layer is correspondingly disposed on a side of the crystal layer away from the seed layer, and the conductive layer has a concave-convex structure.

In some embodiments, the concave-convex structure is any one of an irregular pulse shape, a sawtooth shape, a wave shape, and a concave-convex broken line shape.

In some embodiments, a carrier concentration of the crystalline layer is higher than a carrier concentration of the conductive layer.

In some embodiments, a thickness of the crystalline layer is 5 nm to 50 nm.

In some embodiments, a material of the crystalline layer is zinc oxide (ZnO), silver (Ag), carbon (C), or a combination thereof.

In some embodiments, a material of the seed layer is a metal oxide, a metal, an alloy, or a combination thereof, and a thickness of the seed layer is 5 nm.

In some embodiments, further comprising a source and a drain, wherein the source and the drain are disposed in a region of the seed layer not covered by the semiconductor layer, and the source and the drain are respectively disposed on both sides of the semiconductor layer perpendicular to the first surface.

An array substrate provided by an embodiment of the present application comprises a substrate, a gate, a gate insulating layer, a seed layer, and a semiconductor layer. The substrate comprises a first surface and a second surface that are opposed to each other. The gate partially covers the first surface. The gate insulating layer is disposed on a side of the gate away from the first surface and extends to the first surface. The seed layer is disposed on a side of the gate insulating layer away from the gate. The semiconductor layer partially covers a side of the seed layer away from the gate insulating layer, and a surface of the semiconductor layer away from the seed layer has a concave-convex structure formed by growth of nanocrystalline grains. The concave-convex structure of the semiconductor layer is formed by controlling the growth of nanocrystalline grains on the seed layer, which enhances light absorption of the semiconductor layer and solves the problems of poor light sensitivity and slow response speed of semiconductor devices.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

FIG. 4 is a third structural schematic diagram of an array substrate provided by an embodiment of the application.

FIG. 5 is a first schematic flowchart of a fabrication method for an array substrate method provided by an embodiment of the application.

DETAILED DESCRIPTION

Figure 1:
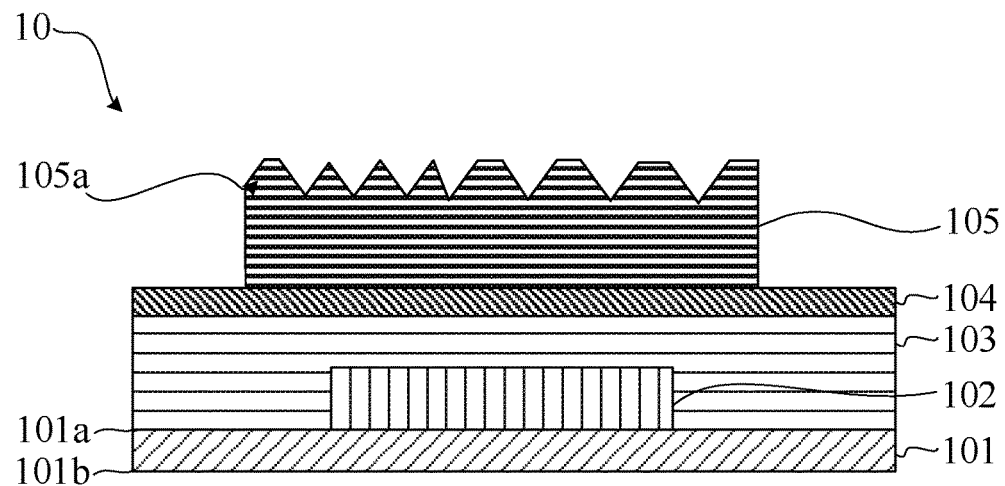
FIG. 1 is a first structural schematic diagram of an array substrate provided by an embodiment of the application.

The technical solutions in the embodiments of the present application will be described clearly and completely with reference to the drawings in the embodiments of the present application. Obviously, the described embodiments are only a part of the embodiments of the present application, but not all the embodiments. Based on the embodiments in the present application, all other embodiments obtained by those skilled in the art without making creative work fall within the protection scope of the present application.

In the description of the present application, it should be understood that the terms "portrait", "lateral", "length", "width", "upper", "lower", "front", "rear", "left", "right", "vertical", "horizontal", "top", "bottom", "inner", "outer", "clockwise", "counterclockwise" etc. indicated orientation or positional relationship is based on the orientation or positional relationship shown in the drawings, only to facilitate the description of this application and simplify the description, not to indicate or imply the device referred to or the element must have a specific orientation, be constructed and operated in a specific orientation, and therefore cannot be understood as a limitation of the present application.

Embodiments of the present application provide an array substrate, a fabrication method for an array substrate, and a display panel. The following is a detailed introduction to the array substrate.

Referring to FIG. 1, FIG. 1 is a first structural schematic diagram of an array substrate 10 provided by an embodiment of the application. The array substrate 10 comprises a substrate 101, a gate (or gate electrode) 102, a gate insulating layer 103, a seed layer 104 (or grown seed layer), and a semiconductor layer 105. The substrate 101 comprises a first surface 101*a* and a second surface 101*b* that are disposed oppositely to each other. The gate 102 partially covers the first surface 101a. The gate insulating layer 103 is disposed on a side of the gate 102 away from the first surface 101a and extends to the first surface 101a. The seed layer 104 is disposed on a side of the gate insulating layer 103 away from the gate 102. The semiconductor layer 105 partially covers a side of the seed layer 104 away from the gate insulating layer 103, and a surface of the semiconductor layer 105 away from the seed layer 104 has a concave-convex structure 105a formed by growth of nanocrystalline grains. The concave-convex structure 105a of the semiconductor layer 105 is formed by controlling the growth of nanocrystalline grains on the seed layer 104, which forms a three-dimensional (3D) microstructure that enhances light absorption of the semiconductor layer 105 and solves the problems of poor light sensitivity and slow response speed of semiconductor devices when it is applied in photoelectric detection photodetector applications.

It should be noted that the first surface 101a may be an upper surface of the substrate 101, and the second surface 101b may be a lower surface of the substrate 101. Of course, the first surface 101a may also be the lower surface of the substrate 101, and the second surface 101b may be the upper surface of the substrate 101. Without special instructions in the embodiment of the present application, the default is that the first surface 101a is the upper surface of the substrate 101, and the second surface 101b is the lower surface of the substrate 101.

Figure 2:
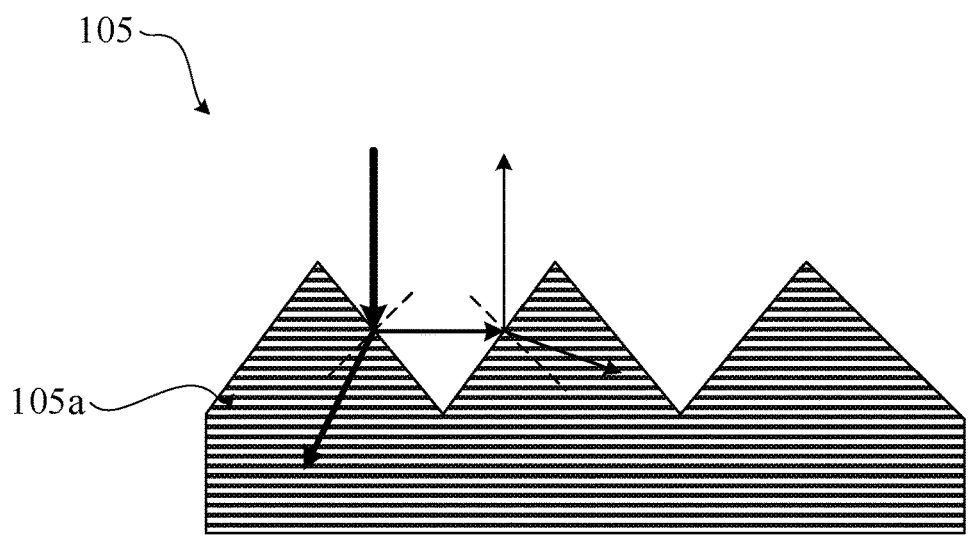
FIG. 2 is a schematic diagram of a principle of reducing reflected light by a concave-convex structure provided by an embodiment of the application.

The concave-convex structure 105a is of any one of an irregular pulse shape, a sawtooth shape, a wave shape, and a concave-convex broken line shape. An irregular pulse shape is shown in FIG. 1, and other shapes are not shown. Furthermore, compared with a conventional structure, light reflectivity of a sawtooth structure can be reduced by 10% to 20%. Please refer to FIG. 2, which is a schematic diagram showing a principle of reducing reflected light by the concave-convex structure 105a provided by an embodiment of the present application. Arrows in the figure represents light, and a width of the arrows represents strength of the light. Since light is reflected and refracted in the concave-convex structure 105a, light absorption efficiency of the semiconductor layer 105 can be improved, thereby increasing light sensitivity.

A material of the gate 102 is a metal material. Specifically, the material of the gate 102 is molybdenum (Mo), aluminum (Al), or a combination thereof.

A thickness of the gate insulating layer 103 is 4000 Å to 8000 Å. Specifically, the thickness of the gate insulating layer 103 may be 4000 Å, 5000 Å, 6000 Å, 7000 Å, or 8000 Å.

A material of the seed layer 104 is a metal oxide, a metal, an alloy, or a combination thereof, and a thickness of the seed layer 104 is 5 nm. Specifically, a material of the seed layer 104 may be aluminum oxide ($Al_2O_3$), copper (Cu), titanium (Ti), tantalum (Ta), or a copper alloy. The seed layer 104 (grown seed layer) can also be used as a barrier layer, and plays a role of barrier and insulation together with the gate insulating layer 103. In addition, the seed layer 104 provides a base layer for subsequent film layer deposition, which enables the semiconductor layer 105 to crystallize uniformly, avoid abnormal growth of nanocrystalline grains, and ensure uniformity and stability of a structure.

Figure 3:
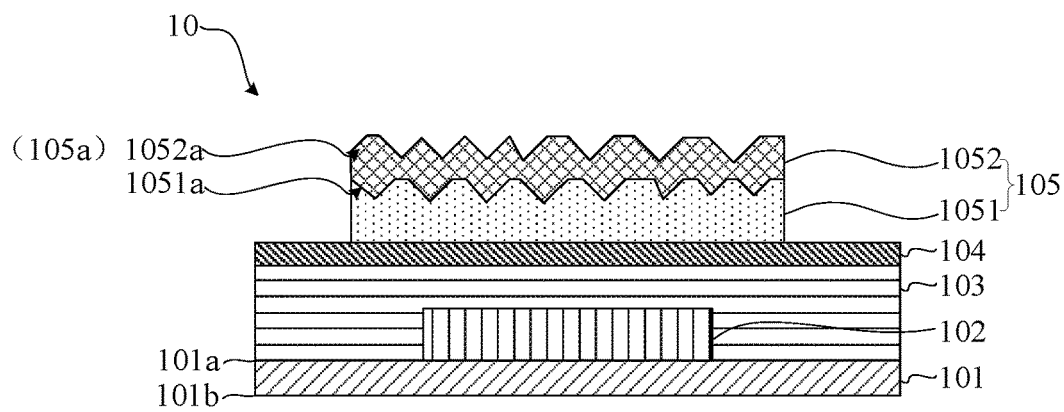
FIG. 3 is a second structural schematic diagram of an array substrate provided by an embodiment of the application.

Referring to FIG. 3, FIG. 3 is a second structural schematic diagram of an array substrate 10 provided by an embodiment of the application. The semiconductor layer 105 comprises a crystalline layer 1051 and a conductive layer 1052. The crystalline layer 1051 partially covers a side of the seed layer 104 away from the gate insulating layer 103. A surface of the crystalline layer 1051 away from the seed layer 104 has a concave-convex structure 1051a formed by growth of nanocrystalline grains. The conductive layer 1052 is correspondingly disposed on a side of the crystalline layer 1051 away from the seed layer 104, and the conductive layer 1052 has a concave-convex structure 1052a that is the concave-convex structure 105a shown in FIG. 1. The crystalline layer 1051 that is easy to crystallize and easy to control grain growth and the conductive layer 1052 with good conductivity are used as the semiconductor layer 105 to form a double-layered semiconductor structure. The crystalline grains of the crystalline layer 1051 grow to form a concave-convex structure 1051a, which facilitates light absorption in the film layer and enhances light absorption of the semiconductor layer 105, thereby increasing the light sensitivity of the array substrate 10 and solving the problem of its slow response speed.

A carrier concentration of the crystalline layer 1051 is higher than a carrier concentration of the conductive layer. Therefore, the double-layered semiconductor structure also improves mobility of the array substrate 10.

A thickness of the crystalline layer 1051 is 5 nm to 50 nm. Specifically, the thickness of the crystalline layer 1051 may be 5 nm, 10 nm, 20 nm, 30 nm, 40 nm, 45 nm, or 50 nm. If the crystalline layer 1051 is too thick, the semiconductor layer 105 will be turned on and the switching characteristics cannot be achieved. A material of the crystalline layer 1051 is zinc oxide (ZnO), silver (Ag), carbon (C), or a combination thereof. Specifically, the silver is a silver nanowire, and the carbon is a carbon nanotube. Grain growth of the above materials is easy to control and easy to crystallize, and it is easier for nanograins to grow to form the concave-convex structure 1051a. This application does not limit the shape of the crystalline grains.

A material of the conductive layer 1052 is any one of indium gallium zinc oxide (IGZO), indium zinc tin oxide (IZTO), indium gallium zinc tin oxide (IGZTO), indium tin oxide (ITO), indium aluminum zinc oxide (IAZO), indium gallium tin oxide (IGTO), or antimony tin oxide (ATO). The above materials have good conductivity and transparency, and are less thick, which does not affect the overall thickness of the display panel. At the same time, it can also reduce electronic radiation, ultraviolet light, and infrared light that are harmful to the human body.

Referring to FIG. 4, FIG. 4 is a third structural schematic diagram of an array substrate 10 provided by an embodiment of the application, wherein the array substrate 10 further comprises a source (or source electrode) 106 and a drain (drain electrode) 107. The source 106 and the drain 107 are disposed in a region of the seed layer 104 not covered by a semiconductor layer 105, and the source 106 and the drain 107 are respectively disposed on both sides of the semiconductor layer 105 perpendicular to a first surface 101a. Positions of the source electrode 106 and the drain electrode 107 shown in FIG. 4 is only for illustration, for better description, and not as a limitation on the position of the source electrode 106 and the drain electrode 107 in the present application. For example, the positions of the source 106 and the drain 107 may be interchanged.

The array substrate 10 provided by the embodiment of the present application forms the concave-convex structure 105a of the semiconductor layer 105 by controlling the growth of nano grains on the seed layer 104 to enhance light absorption of the semiconductor layer 105 and solve the problems of poor light sensitivity and slow response speed. In addition, as the carrier concentration of the crystalline layer 1051 is higher than the carrier concentration of the conductive layer 1052, the double-layered semiconductor structure also improves the mobility of the array substrate 10 and can more effectively convert light into current. Applying the array substrate 10 provided by the embodiment of the present application to a photodetector or a photodetection display panel can enhance light absorption and light sensitivity of the components in the photodetector, so that light is repeatedly refracted in the concave-convex structure 105a, and light absorption of the detector is enhanced. In addition, since the double-layered structure (the crystalline layer 1051 and the conductive layer 1052) in the array substrate 10 has a difference in carrier concentration, it is possible to improve the transfer efficiency of carriers, thereby increasing the photoelectric conversion efficiency and improving photodetection response speed.

An of the present application further provide a fabrication method for an array substrate, and FIG. 5 is a first schematic flowchart of a fabrication method for an array substrate method provided by an embodiment of the application, having specific steps as follows:

Step 201: providing a substrate, wherein the substrate comprises a first surface and a second surface that are disposed oppositely to each other.

Step 202: disposing a gate on the first surface, wherein the gate partially covers the first surface.

Specifically, a physical vapor deposition (PVD) process is performed to deposit a molybdenum aluminum (Mo/Al) alloy as the gate, and the gate is subjected to photolithography and etching to form a pattern after a film is formed. The PVD process is used to dispose the gate. The above process is simple, causes no pollution to the environment, requires fewer consumables, allows for uniform and dense film formation, and has strong bonding with the substrate.

Step 203: disposing a gate insulating layer on a side of the gate away from the first surface, wherein the gate insulating layer extends to the first surface.

Specifically, a silicon oxide film is deposited as the gate insulating layer by a chemical vapor deposition (CVD) method. The CVD method has few requirements for environmental conditions, a convenient manufacturing process, controllable thickness and purity of the deposited gate insulating layer, and high adaptability of the deposited film.

Step 204: disposing a seed layer on a side of the gate insulating layer away from the gate.

Specifically, an atomic layer deposition (ALD) method is used to deposit an aluminum oxide as the seed layer. The aluminum oxide is plated layer by layer on a side of the gate insulating layer away from the gate in a form of a mono-atomic film. Due to the successive deposition of a single atomic layer, the seed layer has an extremely uniform thickness and excellent consistency. This is conducive to uniform crystallization of the semiconductor layer, thereby avoiding abnormal growth of nano crystal grains, and ensuring uniformity and stability of the structure.

In one embodiment, an ALD equipment is used to deposit $Al_2O_3$ of 5 nm thick as the seed layer using trimethyl aluminum ($Al(CH_3)_3$), and a deionized water ($H_2O$) is used as the precursor of Al and oxidant respectively during deposition. $Al_2O_3$ crystals are ionic crystals, which are formed by ionic bonding. Due to the high strength of ionic bonds, the formed $Al_2O_3$ seed layer structure is stable. In addition, the arrangement of ions in the $Al_2O_3$ crystal is tight; the subsequently grown film will be denser; and the grown film will be more uniform.

Step 205: disposing a semiconductor layer on a side of seed layer away from the gate insulating layer, wherein the semiconductor layer partially covers a side of the seed layer, and a surface of the semiconductor layer away from the seed layer has a concave-convex structure formed by growth of nanocrystalline grains.

Figure 6:
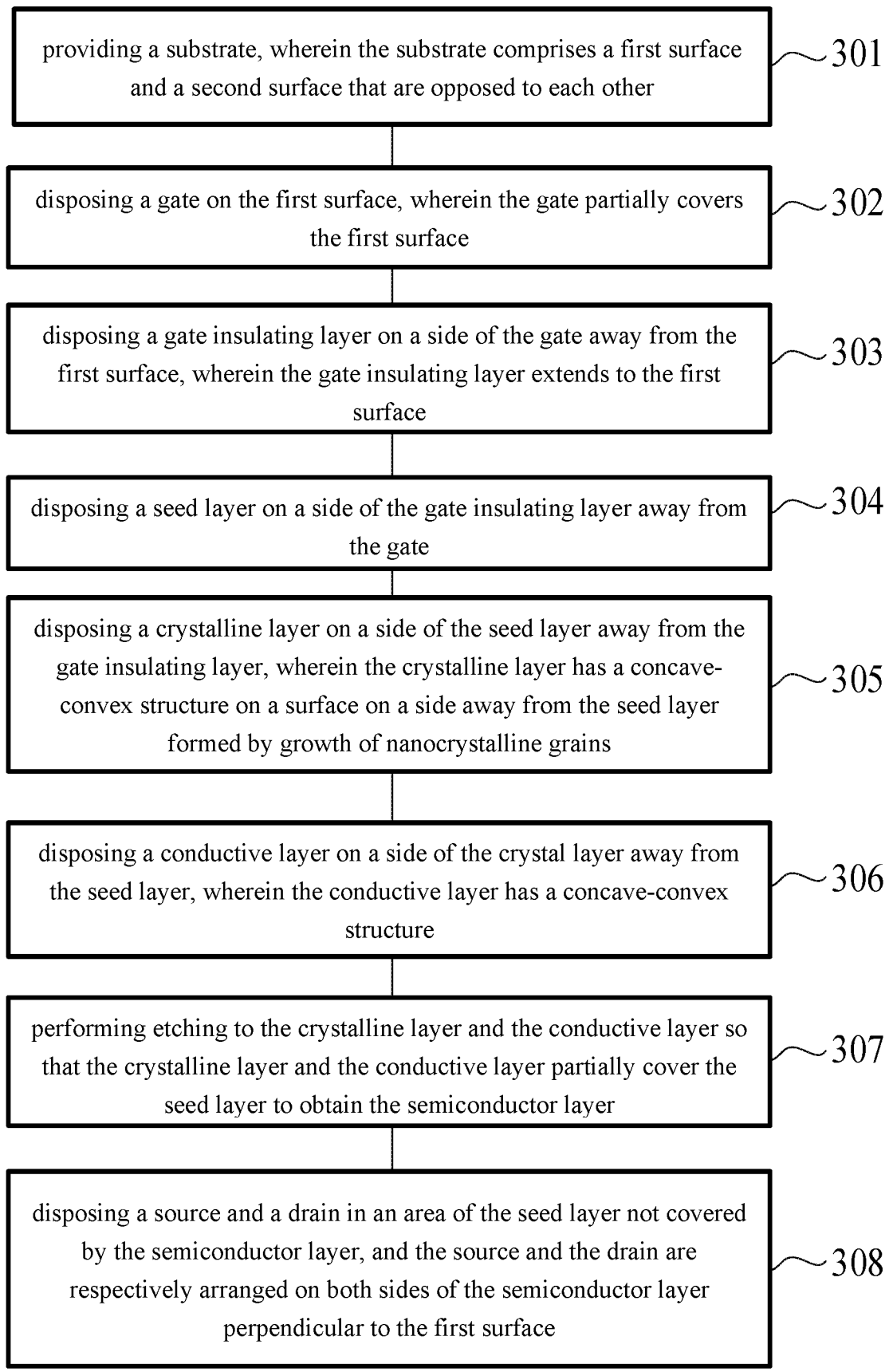
FIG. 6 is a second schematic flowchart of a fabrication method for an array substrate method provided by an embodiment of the application.

Referring to FIG. 6, FIG. 6 is a second schematic flowchart of a fabrication method for an array substrate method provided by an embodiment of the application, having specific steps as follows:

Step 301: providing a substrate, wherein the substrate comprises a first surface and a second surface that are disposed oppositely to each other.

Step 302: disposing a gate on the first surface, wherein the gate partially covers the first surface.

Step 303: disposing a gate insulating layer on a side of the gate away from the first surface, wherein the gate insulating layer extends to the first surface.

Step 304: disposing a seed layer on a side of the gate insulating layer away from the gate.

The specific setting of the above steps is the same as the previous embodiment and will not be repeated here.

Step 305: disposing a crystalline layer on a side of the seed layer away from the gate insulating layer, wherein the crystalline layer has a concave-convex structure on a surface on a side away from the seed layer formed by growth of nanocrystalline grains.

Specifically, the crystalline layer is deposited on the side of the seed layer away from the gate insulating layer using a method of atomic layer deposition, a chemical vapor deposition technique, a sol-gel method, or a sputtering method.

In one embodiment, an ALD device is used to deposit a 12 nm thick ZnO film on a 5 nm thick $Al_2O_3$ film. Diethyl zinc ($Zn(CH_2CH_3)_2$) and deionized water are used as precursors of Zn and oxidant. Argon is used as a carrier gas and a purge gas in the deposition process. The temperature and pressure are set to 150° C. and 0.5 torr respectively. After that, the array substrate was placed in a laboratory oven at 90° C. for 1 hour, and then placed in a heated solution and kept at 90° C. for 2 hours, and finally the array substrate was dried at room temperature to obtain a crystalline layer. After ZnO is grown and formed into a film, it is placed in the heated solution to continue the growth of ZnO through the hydrothermal method, which can make ZnO grow more completely. The heated solution may be a $(Zn(NO_3)_2.6H_2O$ solution.

Through the above conditions, the ZnO nanocrystalline grains are controlled to grow a concave-convex structure, which can enhance light sensitivity of the semiconductor layer and increase a light absorption rate of the semiconductor layer. In addition, a crystal structure of ZnO crystal is similar to that of $Al_2O_3$. On the $Al_2O_3$ seed layer, ZnO can continue to grow along the crystalline orientation of $Al_2O_3$, so ZnO is easier to crystallize and crystallization process is easy to control. The resulting ZnO film is dense and has fewer defects, a uniform structure and excellent performance.

The concave-convex structure of ZnO nanocrystalline grain growth can be controlled by controlling the thickness of $Al_2O_3$. Because the thickness of $Al_2O_3$ is different, a surface roughness and morphology of $Al_2O_3$ film are also different. The greater the thickness of $Al_2O_3$, the more complete the grain growth of $Al_2O_3$ and the larger the grains formed. Therefore, the grain morphology of the growth of ZnO on the $Al_2O_3$ film will also be different.

The present embodiment introduces the ZnO grain growth and film formation with respect to the ALD method, in order to more clearly illustrate the method of controlling the grain growth and film formation in this application, and is not a limitation to the application. ZnO materials are easy to crystallize, and the film forming method and conditions change, and the size of the crystal grains changes more obviously. Therefore, other methods such as CVD or PVD can also be used to achieve similar grain growth into a concave-convex structure. The concavo-convex structure of nanocrystalline grain growth has the effect of reducing the reflectance of light, and the nano concavo-convex structure formed by other methods is within the protection scope of the present application.

Step 306: disposing a conductive layer on a side of the crystal layer away from the seed layer, wherein the conductive layer has a concave-convex structure.

Since the crystalline layer forms nano-crystalline grains and grows a concave-convex structure on a side away from the seed layer, the conductive layer deposited on the crystalline layer naturally has a concave-convex structure.

Step 307: performing etching to the crystalline layer and the conductive layer so that the crystalline layer and the conductive layer partially cover the seed layer to obtain the semiconductor layer.

The entire crystalline layer and the conductive layer are subjected to photolithography and etching processes. On the one hand, the crystalline layer and the conductive layer partially cover the seed layer to leave the required positions for the subsequent source and drain, and on the other hand, the crystalline layer and the conductive layer are patterned.

Step 308: disposing a source and a drain in an area of the seed layer not covered by the semiconductor layer, and the source and the drain are respectively arranged on both sides of the semiconductor layer perpendicular to the first surface.

Specifically, a metal electrode is deposited through a PVD process, and then a source and a drain with patterns are formed by a lithography process and an etching process.

Figure 7:
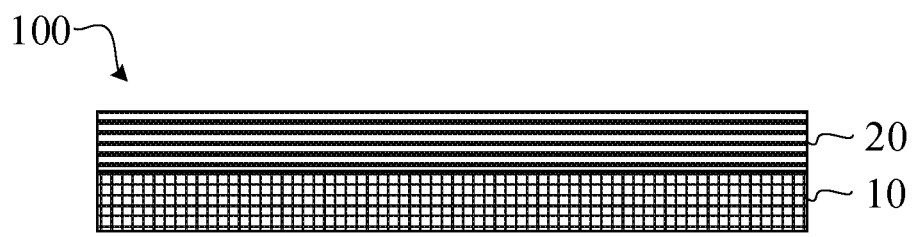
FIG. 7 is a structural schematic diagram of a display panel provided by an embodiment of the application.

An embodiment of the present application provides a display panel 100. FIG. 7 is a schematic structural diagram of the display panel 100 in an embodiment of the present application. The display panel 100 comprises an array substrate 10 and a packaging structure 20, and the display panel 100 may also include other devices. The packaging structure 20 and other devices and their assembly in the embodiments of the present application are related technologies well known to those skilled in the art and will not be repeated here.

The display panel 100 provided by the embodiment of the present application comprises an array substrate 10 and a package structure 20. The array substrate 10 comprises a substrate, a gate, a gate insulating layer, a seed layer, and a semiconductor layer. By controlling the growth of nano crystalline grains on the seed layer to form a concave-convex structure, the light absorption of the semiconductor layer is enhanced, and the problems of poor light sensitivity and slow response speed are solved. A double-layered semiconductor structure also improves mobility of the array substrate 10, and can more effectively convert light into electric current. Semiconductors are exposed to different levels of light, and devices exhibit different electrical properties, whereby light intensity is detected. Since the problem of slow response speed is solved and the mobility of the array substrate 10 is improved, the working efficiency of the display panel 100 is improved, and the power consumption of the display panel 100 is reduced. Specifically, the array substrate 10 provided by the present application can be applied to a photodetector or a photodetection display panel because the light sensitivity and light absorption rate of the array substrate are increased, and the mobility of carriers is improved. It can solve the problem of slow response speed when applied to photoelectric detection.

The array substrate, the fabrication method for an array substrate, and the display panel provided by the embodiments of the present application are introduced in detail. The descriptions of the above embodiments are only used to help understand the technology of the present application, solutions and their core ideas; those of ordinary skill in the art should understand that they can still modify the technical solutions described in the foregoing embodiments or equivalently replace some of the technical features, and these modifications or replacements do not make the essence of the corresponding technical solutions deviate from the scope of the technical solutions of the embodiments of the present application.

What is claimed is:

1. An array substrate, comprising:
 a substrate, wherein the substrate comprises a first surface and a second surface that are disposed oppositely to each other;
 a gate, wherein the gate partially covers the first surface;
 a gate insulating layer, wherein the gate insulating layer is disposed on a side of the gate away from the first surface and extends to the first surface;
 a seed layer, wherein the seed layer is disposed on a side of the gate insulating layer away from the gate;
 a semiconductor layer, wherein the semiconductor layer partially covers a side of the seed layer away from the gate insulating layer, and a surface of the semiconductor layer away from the seed layer has a concave-convex structure formed by growth of nanocrystalline grains; and
 a source and a drain, wherein the source and the drain are disposed in a region of the seed layer not covered by the semiconductor layer, and the source and the drain are respectively disposed on both sides of the semiconductor layer perpendicular to the first surface.

2. The array substrate according to claim 1, wherein the semiconductor layer comprises a crystalline layer and a conductive layer; the crystalline layer partially covers the side of the seed layer away from the gate insulating layer; a surface of the crystalline layer away from the seed layer has a concave-convex structure formed by growth of nanocrystalline grains; the conductive layer is correspondingly disposed on a side of the crystal layer away from the seed layer; and the conductive layer has a concave-convex structure.

3. The array substrate according to claim 2, wherein the concave-convex structure is of any one of an irregular pulse shape, a sawtooth shape, a wave shape, and a broken line shape.

4. The array substrate according to claim 2, wherein a carrier concentration of the crystalline layer is higher than a carrier concentration of the conductive layer.

5. The array substrate according to claim 4, wherein a thickness of the crystalline layer is 5 nm to 50 nm.

6. The array substrate according to claim 2, wherein a material of the crystalline layer is zinc oxide (ZnO), silver (Ag), carbon (C), or a combination thereof.

7. The array substrate according to claim 1, wherein a material of the seed layer is a metal oxide, a metal, an alloy, or a combination thereof, and a thickness of the seed layer is 5 nm.

8. A fabrication method for an array substrate, comprising:
 providing a substrate, wherein the substrate comprises a first surface and a second surface that are disposed oppositely to each other;

disposing a gate on the first surface, wherein the gate partially covers the first surface;

disposing a gate insulating layer on a side of the gate away from the first surface, wherein the gate insulating layer extends to the first surface;

disposing a seed layer on a side of the gate insulating layer away from the gate; and disposing a semiconductor layer on a side of seed layer away from the gate insulating layer, wherein the semiconductor layer partially covers a side of the seed layer, and a surface of the semiconductor layer away from the seed layer has a concave-convex structure formed by growth of nanocrystalline grains, wherein disposing the seed layer on the side of the gate insulating layer away from the gate comprises depositing aluminum oxide as the seed layer using atomic layer deposition.

9. The fabrication method according to claim 8, wherein disposing the semiconductor layer on the side of the seed layer away from the gate insulating layer comprises:

disposing a crystalline layer on a side of the seed layer away from the gate insulating layer, and the crystalline layer has a concave-convex structure on the surface of the side away from the seed layer formed by growth of nanocrystalline grains;

disposing a conductive layer on a side of the crystalline layer away from the seed layer, wherein the conductive layer has a concave-convex structure; and performing etching to the crystalline layer and the conductive layer so that the crystalline layer and the conductive layer partially cover the seed layer to obtain the semiconductor layer.

10. The fabrication method according to claim 9, wherein disposing the crystalline layer on the side of the seed layer away from the gate insulating layer is formed using a method of an atomic layer deposition, a chemical vapor deposition technique, a sol-gel method, or a sputtering method.

11. A display panel, comprising an array substrate, wherein the array substrate comprises:

a substrate, wherein the substrate comprises a first surface and a second surface that are disposed oppositely to each other;

a gate, wherein the gate partially covers the first surface;

a gate insulating layer, wherein the gate insulating layer is disposed on a side of the gate away from the first surface and extends to the first surface;

a seed layer, wherein the seed layer is disposed on a side of the gate insulating layer away from the gate;

a semiconductor layer, wherein the semiconductor layer partially covers a side of the seed layer away from the gate insulating layer, and a surface of the semiconductor layer away from the seed layer has a concave-convex structure formed by growth of nanocrystalline grains; and a source and a drain, wherein the source and the drain are disposed in a region of the seed layer not covered by the semiconductor layer, and the source and the drain are respectively disposed on both sides of the semiconductor layer perpendicular to the first surface.

12. The display panel according to claim 11, wherein the semiconductor layer comprises a crystalline layer and a conductive layer; the crystalline layer partially covers the side of the seed layer away from the gate insulating layer, and a surface of the crystalline layer away from the seed layer has a concave-convex structure formed by growth of nanocrystalline grains;

and the conductive layer is correspondingly disposed on a side of the crystalline layer away from the seed layer, and the conductive layer has a concave-convex structure.

13. The display panel according to claim 12, wherein the concave-convex structure is of any one of an irregular pulse shape, a sawtooth shape, a wave shape, and a broken line shape.

14. The display panel according to claim 12, wherein a carrier concentration of the crystalline layer is higher than a carrier concentration of the conductive layer.

15. The display panel according to claim 14, wherein a thickness of the crystalline layer is 5 nm to 50 nm.

16. The display panel according to claim 12, wherein a material of the crystalline layer is zinc oxide (ZnO), silver (Ag), carbon (C), or a combination thereof.

17. The display panel according to claim 11, wherein a material of the seed layer is a metal oxide, a metal, an alloy, or a combination thereof, and a thickness of the seed layer is 5 nm.

* * * * *